United States Patent [19]
Kikuchi

[11] 4,419,596
[45] Dec. 6, 1983

[54] POWER ON CLEAR CIRCUIT

[75] Inventor: Hideo Kikuchi, Yokohama, Japan

[73] Assignee: Fujitsu Limited, Kawasaki, Japan

[21] Appl. No.: 146,212

[22] Filed: May 5, 1980

[30] Foreign Application Priority Data

May 9, 1979 [JP] Japan .................................. 54-56774

[51] Int. Cl.³ ..................... H03K 5/163; H03K 17/22; H03K 17/284
[52] U.S. Cl. .................................... 307/603; 307/246; 307/593; 307/594; 377/107
[58] Field of Search .................. 307/220 C, 251, 296, 307/247 R, 246, 212, 273, 274, 592, 593, 595, 597, 290, 291, 292, 576, 579, 583, 585, 451, 603; 328/41, 42, 48; 377/107

[56] References Cited
U.S. PATENT DOCUMENTS

| | | |
|---|---|---|
| 3,605,025 | 9/1971 | Lincoln et al. ................... 328/42 X |
| 3,893,190 | 7/1975 | Robbins ......................... 307/290 X |
| 4,057,738 | 11/1977 | Nishimura ..................... 307/291 X |

Primary Examiner—Larry N. Anagnos
Assistant Examiner—David R. Hudspeth
Attorney, Agent, or Firm—Staas & Halsey

[57] ABSTRACT

A power on clear circuit in which a flip-flop circuit is formed by cross connecting two gate circuits which have logically inverting functions, with the output of the flip-flop circuit being used to automatically clear a group of memory elements after the power supply is turned on. After all of the circuits in the group have been cleared, the cleared state is detected and the flip-flop circuit is reset by a detection signal.

29 Claims, 9 Drawing Figures

POWER ON CLEAR CIRCUIT

BACKGROUND OF THE INVENTION

1. Field of the Invention

The present invention relates to "power on clear" circuit which sets or resets memory elements, such as flip-flop circuits in an integrated circuit to, a predetermined state when the power supply is turned on.

2. Description of the Prior Art

Integrated circuits consist of various circuit elements such as gates, flip-flop circuits, and the like. Among them, elements such as flip-flop circuits, which will stably assume a given state among a plurality of states, must reliably acquire a set state when they are set or a reset state when they are reset at the time when the power supply is turned on, i.e., at the time when the operation is started. Such an initial state can be set by feeding a set signal or a reset signal from an external unit. In this case, however, the number of pins of the integrated circuit is increased by one as a matter of course. Therefore, it has been proposed to provide the integrated circuit with a circuit which generates the set or reset signal when the power supply is turned on.

Figure 1:
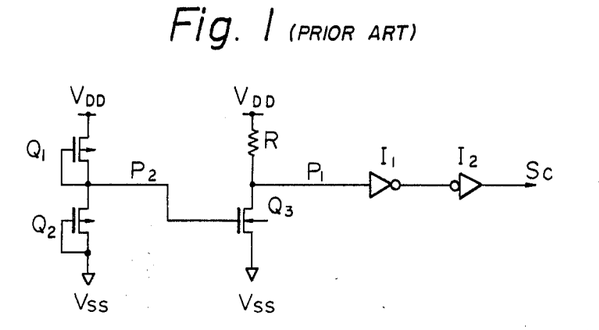
FIG. 1 is a circuit diagram of a conventional power on clear circuit.

An example of a power on clear circuit has been disclosed in the specification of Japanese patent application No. 127242/77 that was filed in Japan. The above circuit consists, as shown in FIG. 1, of p-channel field effect transistors $Q_1$ and $Q_2$, which are connected in series, and a resistor R and an n-channel field effect transistor $Q_3$, which are connected in series, wherein the gates and sources of each of the transistors $Q_1$ and $Q_2$ are short-circuited, a terminal or connection point $P_2$ between the transistor $Q_1$ and the transistor $Q_2$ is connected to the gate of the transistor $Q_3$, the drain of the transistor $Q_1$ and one end of the resistor R are connected to a high-potential source $V_{DD}$, the sources of the transistors $Q_2$ and $Q_3$ are connected to a low-potential source $V_{SS}$, and an output pulse is obtained from a terminal or connection point $P_1$ between the resistor R and the transistor $Q_3$. According to the abovementioned conventional circuit, when the potential of the source $V_{DD}$ starts to rise after being turned on, the potential at point $P_1$ is raised as this point is interlocked to the potential $V_{DD}$ through the resistor R, while at the same time stray capacitors are being electrically charged. As the potential $V_{DD}$ reaches a threshold voltage Vth of, for example, 1 volt, the transistor $Q_1$ is rendered conductive, and the gate potential of the transistor $Q_3$ starts to rise. As the gate potential reaches the threshold voltage Vth, the transistor $Q_3$ is rendered conductive, and the potential at the output terminal decreases. Thus, a voltage having the waveform of a mountain is obtained and is shaped to produce a clear signal for the flip-flop circuits. The above circuit generates a clear signal during the interval between the time when the potential $P_1$ is raised by the resistor R and the time when the potential at $P_1$ is lowered by the transistors $Q_1$, $Q_3$. Therefore, a sufficient time interval can be obtained to produce a clear signal of the desired pulse width when the potential of the power source $V_{DD}$ rises relatively slowly. When the voltage $V_{DD}$ rises quickly, however, the time difference becomes small, and the width of the clear pulse becomes so narrow that it is difficult to guarantee reliable operation. With this circuit, furthermore, the transistors $Q_1$ to $Q_3$ are all rendered conductive when the power supply is turned on; electric current is consumed at all times by the transistors $Q_1$, $Q_2$, $Q_3$ and by the resistor R. One advantage of a CMOS chip is that no current is permitted to flow during the above rest state. With the power on clear circuit, however, a constant current flows at all times.

OBJECTS AND SUMMARY OF THE INVENTION

The object of the present invention is to provide a circuit which is capable of being cleared very reliably when the power supply is turned on without depending upon the rise-time characteristics of the power supply or data introduced from external units.

Another object of the present invention is to provide a power on clear circuit which does not consume electric power during the rest state.

A further object of the present invention is to provide a power on clear circuit which can be effectively used for integrated circuits that require a high degree of reliability.

In order to achieve the above-mentioned objects, the present invention provides a power on clear circuit in which a flip-flop circuit is formed by cross-connecting two gate circuits having logically inverting functions, with a group of memory elements being cleared by the output of the flip-flop circuit; and after all of the circuits in the group have been cleared, the cleared state is detected and the flip-flop circuit is reset by a detection signal.

Further features and advantages of the present invention will become apparent from the ensuing description with reference to the accompanying drawings to which, however, the scope of the invention is in no way limited.

DESCRIPTION OF THE PREFERRED EMBODIMENTS

Figure 2:
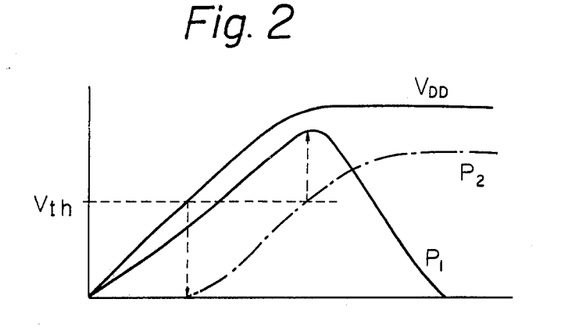
FIG. 2 is a wave form diagram for illustrating the operation of the power on clear circuit of FIG. 1.

FIG. 1 illustrates a conventional power on clear circuit which consists of p-channel field effect transistors $Q_1$, $Q_2$, a resistor R, and an n-channel field effect transistor $Q_3$. When the voltage $V_{DD}$ of the power supply rises after being turned on, as indicated by a curve $V_{DD}$ in FIG. 2, the voltage at the terminal $P_1$, which is maintained at $V_{DD}$ through the resistor R, rises along with the voltage $V_{DD}$ while charging the stray capacitors, as indicated by a curve $P_1$ in FIG. 2. When the voltage $V_{DD}$ reaches a threshold voltage Vth of, for example, 1 volt (it is assumed here that the transistors $Q_1$ to $Q_3$ all have the same threshold voltage Vth), the transistor $Q_1$ is rendered conductive, and the potential at the terminal P$_2$ rises, as indicated by a curve P$_2$ in FIG. 2. As the potential at the terminal P$_2$ reaches the threshold voltage Vth, the n-channel transistor Q$_3$ is rendered conductive (Vss is assumed to be 0 volt here), whereby the potential at the terminal P$_1$ starts to decrease as illustrated. Therefore, a voltage having the wave form of a mountain is obtained at the terminal P$_1$, is shaped through two stages of inverters I$_1$ and I$_2$ and is converted into a clear signal Sc for the flip-flop circuit. This circuit generates a clear signal during the interval between the the time when the potential at the point P$_1$ is raised by the resistor R and the the time when the potential at the point P$_1$ is lowered by the transistors Q$_1$, Q$_3$. Therefore, a sufficient time interval can be obtained to produce a clear signal of a desired pulse width when the potential of the power supply V$_{DD}$ rises relatively slowly. When the voltage V$_{DD}$ rises quickly, however, the time difference becomes small, and the width of the clear pulse becomes so narrow that it is difficult to guarantee reliable operation. With this circuit, furthermore, the transistors Q$_1$ to Q$_3$ are all rendered conductive when the power supply is turned on; electric current is consumed at all times by the transistors Q$_1$, Q$_2$, Q$_3$ and by the resistor R. One advantage of a CMOS chip is that no current is permitted to flow during the rest state. With the power on clear circuit illustrated in FIG. 1, however, a constant current flows at all times.

Figure 3:
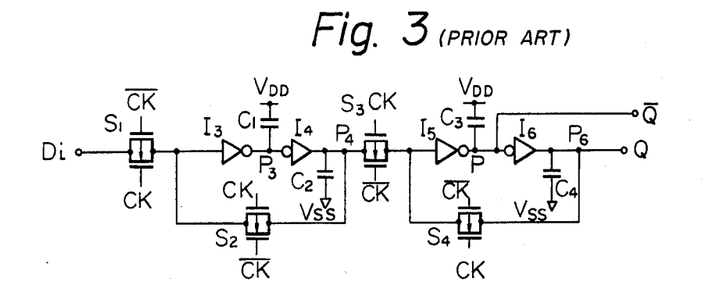
FIG. 3 is a circuit diagram of another conventional power on clear circuit.

The circuit of FIG. 3 sets the initial state by means of capacitors. In FIG. 3, symbols I$_3$ through I$_6$ denote inverters, and S$_1$ through S$_4$ denote switches each consisting of an n-channel FET and a p-channel FET which are connected in parallel, and the gates of which are served with a clock signal CK and an inverted clock signal $\overline{CK}$. As will be obvious from FIG. 3, the switches S$_1$, S$_3$ and S$_2$, S$_4$ open and close in an opposite manner relative to each other. A latching circuit is formed, when the switches S$_2$ and S$_4$ are rendered conductive, and the inputs to the inverters I$_3$, I$_5$ at this moment are, for example, at a high level, which causes the inputs to the inverters I$_4$, I$_6$ to assume a low level and the outputs of the inverters I$_4$, I$_6$ to assume a high level. The high level outputs are then fed to the inverters I$_3$, I$_5$ and are latched in this state, even when no inputs are fed thereafter. Symbols C$_1$ through C$_4$ denote capacitors for setting the initial state. The capacitor C$_1$ connects the output terminal of the inverter I$_3$ of the first state to the power supply V$_{DD}$, the capacitor C$_2$ connects the output terminal of the inverter I$_4$ of the second stage to the power supply (ground) V$_{SS}$, the capacitor C$_3$ connects the output terminal of the inverter I$_5$ of the third stage to the power supply V$_{DD}$, and the capacitor C$_4$ connects the output terminal of the inverter I$_6$ of the fourth stage to the power supply V$_{SS}$. That is, these capacitors alternately connect the output terminals P$_3$, P$_4$, P$_5$ and P$_6$ (which, in other words, are input terminals of the inverters of the subsequent stages) of the inverters, which are connected in a cascade sequence, to the power supplies V$_{DD}$ and V$_{SS}$. When the power supply is turned on, the capacitors C$_1$, C$_3$ raise the potentials at the points P$_3$, P$_5$ to a high level, and the capacitors C$_2$, C$_4$ lower the potentials at the points P$_4$, P$_6$ to a low level, whereby the latches I$_3$, I$_4$ on the master side and the latches I$_5$, I$_6$ on the slave side acquire the states of high level and low level at all times. The initial states are thus set.

This circuit is also equipped with circuits for generating clock pulses CK and $\overline{CK}$, which will be operated when the power supply is turned on. Whether the output states of the clock pulse generator circuits will be of a high level or a low level, however, is subject to change. If the clock pulse CK is at a high level and the clock pulse $\overline{CK}$ is at a low level, the switch S$_1$ for taking the data is opened and the switch S$_2$ for latching is closed. Therefore, when the potentials at the points P$_3$, P$_4$ are set to a high level and a low level by the capacitors, such potentials may be inverted by a data Di fed to the input terminal. Namely, with this circuit, there will be no problem if the clock pulses assume the latching mode when the power supply is turned on. When the clock pulses acquire the mode for introducing the data, as mentioned above, however, the states of the flip-flops I$_3$ through I$_6$ are determined by the data Di and cannot be guaranteed to operate as expected.

The circuit of FIG. 3 is cleared by the capacitors C$_1$ to C$_4$, not by the signals. Furthermore, the circuit of FIG. 3 sets the initial state by itself without the need of reset signals. Besides, the capacitors can be formed by utilizing the stray capacitance of the electrode wirings. Unlike the circuits which necessitate clear signals, therefore, the circuit of FIG. 3 requires no wiring for introducing the clear signals and features a simplified circuit formation. The defect of the circuit of FIG. 3, however, is that the capacitors make the operation of the circuit slow and a high degree of reliability cannot be obtained because of the ambiguity of internal clock signal CK and $\overline{CK}$.

Figure 4:
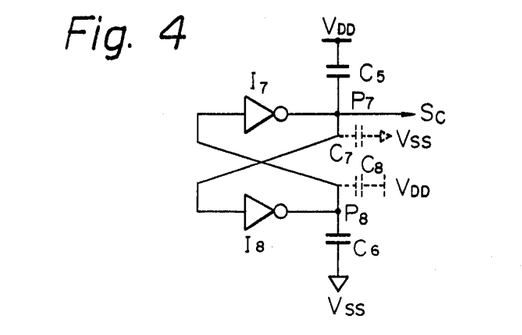
FIG. 4 is a diagram of a flip-flop circuit which is employed for a power on clear circuit of the present invention.
Figure 5:
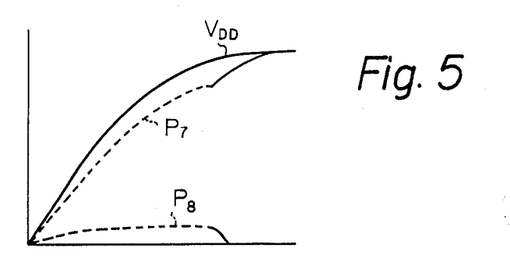
FIGS. 5 and 6 are waveform diagrams for illustrating the operation of the flip-flop circuit of FIG. 4.
Figure 6:
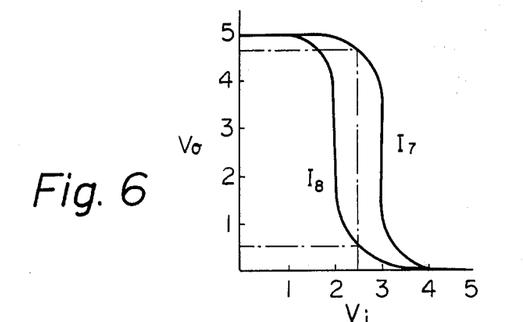
Figure 7:
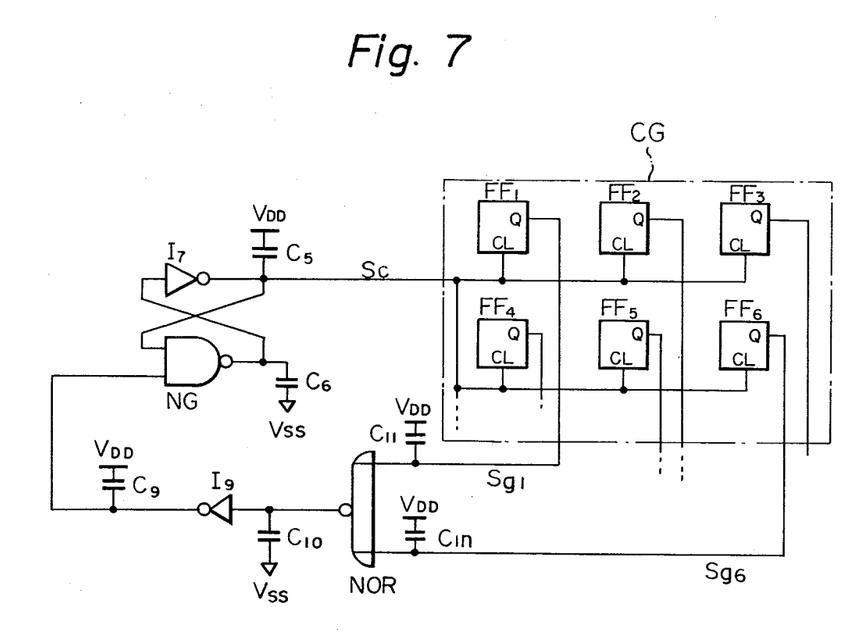
FIG. 7 is a circuit diagram of a power on clear circuit according to an embodiment of the present invention.

FIG. 4 illustrates a fundamental portion of the circuit according to the present invention, in which symbols I$_7$ and I$_8$ denote inverters which constitute a flip-flop circuit which the input and output terminals are cross-connected, symbol C$_5$ denotes a capacitor connected between the output terminal of the inverter I$_7$ and the power supply V$_{DD}$, and symbol C$_6$ denotes a capacitor connected between the output terminal of the inverter I$_8$ and the power supply V$_{SS}$. The output terminals and associated wirings necessarily establish stray capacitors, as denoted by C$_7$ and C$_8$ in FIG. 4. With this setup, when the power supply is turned on, the potential at the output terminal P$_7$ of the inverter I$_7$, i.e., the potential at the input terminal of the inverter I$_8$, is raised to the power supply voltage V$_{DD}$ through the capacitor C$_5$ (since C$_5$ is greater than C$_7$, the force for lowering the potential to V$_{SS}$ by the capacitor C$_7$ is weak) and acquires a high level, while the potential at the output termainl P$_8$ of the inverter I$_8$, i.e., the potential at the input terminal of the inverter I$_7$, is pulled to the power supply voltage V$_{SS}$ by the capacitor C$_6$ (C$_6$ is greater than C$_8$) and acquires a low level. Once such states are established, they are latched relative to each other and remain unchanged. FIG. 5 is a diagram to illustrate the above relation, in which curves P$_7$ and P$_8$ represent the changes in potential at the points P$_7$ and P$_8$ of FIG. 4. The operation will be performed as mentioned above when the power supply voltage V$_{DD}$ rises at a speed faster than the ordinarily occuring speed. When the power supply voltage rises very slowly, however, the capacitors C$_5$ and C$_6$ will fail to satisfactorily function for raising and lowering the potentials. To cope with such a situation according to the present invention, the inverters I$_7$ and I$_8$ have dissimilar threshold levels. The curve I$_7$ of FIG. 6 represents the input voltage Vi vs. output voltage Vo characteristics of the inverter I$_7$, and the curve I$_8$ represents the input voltage Vi vs. output voltage Vo characteristics of the inverter I$_8$. In this case, the output of inverter I$_7$ is low with an input voltage of greater than 3 volts, and the output of inverter $I_8$ is low with an input voltage of greater than 2 volts. According to the thus constructed circuit of the present invention, even when the worst situation happens, i.e., even when the same potential is developed at the points $P_7$ and $P_8$, the inverter $I_7$ responds as though the input potential were at a low level when the power supply voltage $V_{DD}$ is raised to 2.5 volts while the inverter $I_8$ responds as though the same potential were at a high level. Consequently, the high level and low level output states are established. Thus, irrespective of whether the power supply voltage is raised slowly or quickly, the inverter $I_7$ produces a high level and the inverter $I_8$ produces a low level output, as expected. The potential at the output terminal $P_7$ serves as a clear signal Sc which, however, rises with the rise in the power supply voltage $V_{DD}$, and assumes the high level at all times as long as the power supply is turned on. In order to obtain a clear signal which remains in the low level and which rises only when the power supply is turned on, the flip-flop circuit should be reset. FIG. 7 illustrates a circuit therefor.

Referring to FIG. 7, symbols $I_7$, $C_5$ and $C_6$ denote the same members as those of FIG. 4, the inverter $I_8$ for introducing the reset signal is replaced by a NAND gate NG, and the capacitors $C_7$, $C_8$ have not been illustrated. Symbol CG denotes a group of circuits on a chip of an integrated circuit which includes flip-flop circuits $FF_1$ through $FF_6$ that will be cleared upon the turning on of the power supply. Symbol NOR denotes a NOR gate having a plurality of input terminals for receiving introduced signals which indicate that the elements in the circuit group CG are cleared or, in other words, which will receive outputs $Sg_1$ through $Sg_6$ from the terminal Q of the flip-flop circuits.

According to this circuit, when the power supply is turned on, a clear signal Sc is reliably generated as mentioned above, and is introduced into clear terminals CL thereby to clear the circuit group CG. As the circuit group CG is cleared, the signals $Sg_1$ through $Sg_6$ all assume the low level, so that the output of the NOR gate assumes the high level, the output of the inverter $I_9$ assumes the low level, and the output of the NAND gate NG assumes the high level. Consequently, the output of the inverter $I_7$, i.e., the clear signal Sc, assumes the low level. Thus, according to the circuit of the present invention, the clear signal is reliably generated when the power supply is turned on, and the clear signal is extinguished when the circuits in the group are cleared, making it possible to very reliably clear the circuits upon the turning on of the power supply. Symbols $C_9$, $C_{10}$, $C_{11}$ to $C_{1n}$ denote capacitors similar to the capacitors $C_5$, $C_6$, which hold the output conductor and input conductor of the inverter $I_9$, as well as conductors of the signals $Sg_1$ to $Sg_n$, at the desired high level and the low level when the power supply is turned on. In particular, the capacitors $C_{11}$ to $C_{1n}$ function to reliably detect the reset state of the circuit group CG. Some of the signals $Sg_1$ through $Sg_n$ or, depending upon the case, all of the signals $Sg_1$ through $Sg_n$ may be of the low level, despite the fact the reset pulse has not yet been received. In particular, with reference to the latter case, i.e., when all of the signals $Sg_1$ through $Sg_n$ are at the low level, the output of the NOR gate may assume the high level, the output of the inverter $I_9$ may assume the low level, and the clear pulse Sc may readily be converted into the low level or sometime, the pulse may not clear, be produced.

However, such an erroneous operation can be reliably prevented if the signal lines are served with the power supply potential $V_{DD}$ through the capacitors $C_{11}$ to $C_{1n}$.

Figure 8:
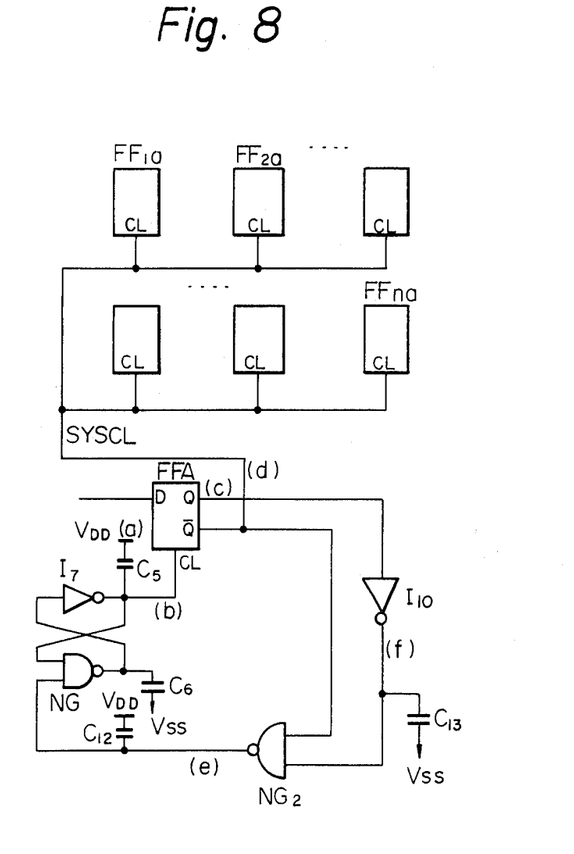
FIG. 8 is a diagram of the power on clear circuit according to another embodiment of the present invention; and Diagrams (a) to (f) of FIG. 9 illustrate waveforms at each of the portions of the circuit of FIG. 8.

FIG. 8 shows the circuit according to another embodiment of the present invention. In the circuit of FIG. 7, the increase in the number of flip-flop circuits results in a greatly increased number of the signals $Sg_1$ through $Sg_1$ to detect that the flip-flop circuits are cleared, and the circuit setup becomes complicated. The circuit of FIG. 8 is to eliminate the above-mentioned defect. In the circuit of FIG. 8, there is no need to make sure that all of the flip-flop circuits $FF_{1a}$ through $FF_{na}$ have been cleared; a reset signal is generated when only one flip-flop circuit is confirmed. In the circuit of FIG. 8, the inverter $I_7$, NAND gate and capacitors $C_5$, $C_6$ are the same as those of the circuit of FIG. 7. A high level output from the inverter $I_7$ clears the flip-flop FFA, which then produces from its terminal $\overline{Q}$ a system clear output SYSCL of the high level for clearing the flip-flop circuits $FF_{1a}$ through $FF_{na}$. On the other hand, the low level output produced from the terminal Q of the flip-flop circuit FFA is converted to a high level by inverter $I_{10}$ and is fed to a first input terminal of a NAND gate $NG_2$. The high level output produced from the terminal $\overline{Q}$ of the flip-flop FFA is directly fed to a second input terminal of the NAND gate $NG_2$. Accordingly, the low level output produced by the NAND gate $NG_2$ is fed as a reset input to one input terminal of a NAND gate NG. Furthermore, a capacitor $C_{12}$ is connected between the output terminal of the NAND gate $NG_2$ and the high-potential supply $V_{DD}$, and a capacitor $C_{13}$ is connected between the output terminal of the inverter $I_{10}$ and the low-potential supply $V_{SS}$.

Figure 9:
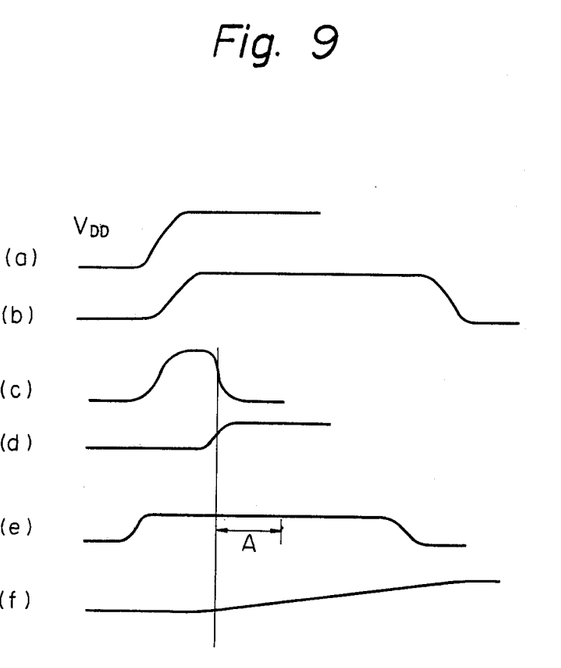

The operation of the circuit of FIG. 8 will be illustrated below with reference to waveforms of each of the portions shown in FIG. 9. Symbols (a), (b), (c), (d), (e) and (f) in the diagram of FIG. 8 correspond to (a), (b) (c), (d), (e) and (f) of FIG. 9. Namely, the diagram (a) of FIG. 9 represents a voltage wave form of the power supply $V_{DD}$, the diagram (b) represents the output of the inverter $I_7$, i.e., represents a clear signal which rises accompanying the voltage $V_{DD}$, the diagram (c) represents a voltage waveform at the output terminal Q when a logic level "1" is applied to the flip-flop circuit FFA. The level "1" is cleared by the clear signal to obtain a system clear signal SYSCL as shown in the diagram (d) of FIG. 9. The diagram (e) of FIG. 9 represents the voltage waveform of the reset output produced by the NAND gate $NG_2$ upon receipt of the signal which is obtained by inverting the output of the terminal Q shown in the diagram (c) and upon receipt of the signal produced from the output terminal $\overline{Q}$ as shown in the diagram (d). The portion A in the diagram (e) represents the time for clearing the flip-flop circuits $FF_{1a}$ through $FF_{na}$. Since the capacitor $C_{13}$ is connected between the output terminal of the inverter $I_{10}$ and the potential supply $V_{SS}$, the output of the inverter $I_{10}$ rises as shown in the diagram (f) of FIG. 9. Accordingly, the output of the NAND gate $NG_2$ resets the output clear signal of the inverter $I_7$.

According to the circuit constructed as illustrated in FIG. 8, there is no need to make sure whether all of the flip-flop circuits are cleared; only one flip-flop circuit needs to be confirmed as to whether it is cleared. Moreover, the flip-flop circuit FFA can be used not only to clear the circuits upon the turning on of the power supply, but also to maintain a stand-by state of the integrated circuits.

As illustrated in detail in the foregoing, the circuit according to the present invention functions very reliably for clearing the circuits when the power supply is turned on, without being affected by the rise-time characteristics of the power supply or the input data, and produces superior performance when it is employed for integrated circuits which require a high degree of reliability.

I claim:

1. A power-on clear circuit comprising:
    a flip-flop which is placed in a set state so as to provide an output signal when a power supply is turned on;
    means for feeding the output signal to a circuit that is to be cleared when the power supply is turned on;
    detection means for detecting that said circuit is cleared by the output signal and for providing a detection signal;
    means for delaying the generation of said detection signal, said delaying means being connected to said detection means; and
    means for feeding said detection signal to said flip-flop to place it in a reset state.

2. A power-on clear circuit according to claim 1, wherein said flip-flop comprises first and second logically inverting gate circuits cross-connected to each other.

3. A power-on clear circuit according to claim 2, wherein said first gate circuit is in inverter circuit and said second gate circuit is a NAND gate.

4. A power-on clear circuit according to claim 2, further comprising first capacitor means for connecting the output terminal of said first gate circuit to the high-potential side of the power supply, and second capacitor means for connecting the output terminal of said second gate circuit to the low-potential side of said power supply.

5. A power-on clear circuit according to claim 2 or 3, wherein the threshold voltage of said first gate circuit is greater than the threshold voltage of said second gate circuit.

6. A power-on clear circuit comprising:
    a first inverter circuit and a NAND gate circuit which are cross-connected to each other;
    first capacitor means for connecting the output terminal of said first inverter circuit and the high-potential side of a power supply;
    second capacitor means for connecting the output terminal of said NAND gate circuit and the low-potential side of said power supply;
    means for supplying the output of said first inverter circuit to circuits that are to be cleared;
    detection means for detecting that said circuits are cleared, said detection means including a NOR circuit connected to said circuits that are to be cleared; and
    a second inverter circuit having an input connected to the output of said NOR circuit and an output connected to an input terminal of said NAND gate circuit.

7. A power-on clear circuit according to claim 6, further comprising third capacitor means for connecting the output terminal of said NOR circuit and said low-potential side of the power supply, and fourth capacitor means for connecting the output terminal of said second inverter and said high-potential side of the power supply.

8. A power-on clear circuit comprising:
    a first flip-flop circuit;
    a second flip-flop circuit which is reset by the output of said first flip-flop circuit, and which provides a first output for clearing circuits which are to be cleared and a second output; and
    logic gate means responsive to the first and second outputs of said second flip-flop circuit for providing a reset signal to said first flip-flop circuit.

9. A power-on clear circuit according to claim 8, wherein said first flip-flop circuit comprises first and second logically inverting gate circuits cross-connected to each other.

10. A power-on clear circuit according to claim 9, wherein said first gate circuit is a first inverter circuit and said second gate circuit is a first NAND gate.

11. A power-on clear circuit according to claim 9, further comprising first capacitor means for connecting the output terminal of said first gate circuit and the high-potential side of a power supply, and second capacitor means for connecting the output terminal of said second gate circuit and the low-potential side of said power supply.

12. A power-on clear circuit according to claim 9, or 10, wherein the threshold voltage of said first gate circuit is greater than the threshold voltage of said second gate circuit.

13. A power-on clear circuit according to claim 8, wherein said logic gate means comprises an inverter circuit having an input connected to the second output of said second flip-flop circuit, and a NAND gate having a first input connected to the first output of said second flip-flop circuit and a second input connected to the output of said inverter circuit.

14. A power-on clear circuit for clearing storage elements on an integrated circuit chip when the power supply is turned on, the storage elements having clear inputs and storage outputs and the integrated circuit chip having first and second pins for connection to a power supply, comprising:
    a first flip-flop fabricated on said chip and having an output port;
    first means connecting said first flip-flop and at least one of said first and second pins for setting said first flip-flop when said power supply is turned on;
    second means connecting the output port of said first flip-flop and the clear inputs of said storage elements for clearing said storage elements when said first flip-flop is set; and
    third means fabricated on said chip for resetting said first flip-flop after said storage elements have been cleared;
    wherein said first flip-flop comprises first and second cross-connected gates and wherein said first means comprises a capacitor connecting the output of said first gate and one of said first and second pins.

15. The circuit of claim 14, wherein said second means comprises a conductor connecting the output port of said first flip-flop and the clear inputs of said storage elements.

16. The circuit of claim 15, wherein said third means comprises a gate having inputs connected to the storage outputs of said storage elements and an output connected to means for resetting said first flip-flop.

17. The circuit of claim 14, wherein said second means comprises a second flip-flop having a clear input and first and second storage outputs, the clear input of said second flip-flop being connected to the output port of said first flip-flop and one of said first and second storage outputs of said second flip-flop being connected to the clear inputs of said storage elements.

18. The circuit of claim 17, wherein said third means comprises means connected to the first and second storage outputs of said second flip-flop for resetting said first flip-flop.

19. The circuit of claim 14, wherein said first and second gates have different input threshold levels.

20. The circuit of claim 19, wherein said first gate comprises a first inverter and said second gate comprises a first NAND gate having first and second inputs, the output of said first inverter being the output port of said first flip-flop and being connected to said first input of said first NAND gate, and the output of said first NAND gate being connected to the input of said first inverter.

21. The circuit of claim 20, wherein said capacitor connects the output of said first inverter and said first pin.

22. The circuit of claim 21, wherein said first means further comprises a capacitor connected between the output of said first NAND gate and said second pin.

23. The circuit of claim 20, 21, or 22, wherein said second means comprises a conductor connecting the output of said first inverter and the clear inputs of said storage elements.

24. The circuit of claim 23, wherein the storage outputs of said storage elements are the Q outputs and wherein said third means comprises a NOR gate having inputs connected to the Q outputs of said storage elements and an inverter having an input connected to the output of said NOR gate and an output connected to the second input of said first NAND gate.

25. The circuit of claim 24, wherein said third means comprises capacitors connected between the inputs of said NOR gate and said first pin.

26. The circuit of claim 25, wherein said third means further comprises a capacitor connected between the output of said NOR gate and said second pin and a capacitor connected between the second input of said first NAND gate and said first pin.

27. The circuit of claim 20, 21, or 22, wherein said second means comprises a second flip-flop having a clear input and Q and $\overline{Q}$ outputs, the clear input of said second flip-flop being connected to the output of said first inverter and the $\overline{Q}$ output being connected to the clear inputs of said storage elements.

28. The circuit of claim 27, wherein said third means comprises a second inverter having a input connected to the Q output of said second flip-flop and a second NAND gate having a first input connected to the $\overline{Q}$ output of said second flip-flop a second input connected to the output of said second inverter, and an output connected to the second input of said first NAND gate.

29. The circuit of claim 28, further comprising a capacitor connected between the output of said second inverter and said second pin, and a capacitor connected between the output of said second NAND gate and said first pin.

* * * * *

UNITED STATES PATENT AND TRADEMARK OFFICE
CERTIFICATE OF CORRECTION

PATENT NO. : 4,419,596
DATED : December 6, 1983
INVENTOR(S) : Hideo Kikuchi

It is certified that error appears in the above-identified patent and that said Letters Patent is hereby corrected as shown below:

```
Front Page, [57] ABSTRACT, line 1, "power on" should be
                      --power-on--;
          line 2, "cross connecting" should be --cross-connecting--.
Column 1,  line 6,  after "to" insert --a--;
           line 41, "abovemen-" should be --above-men- --;
           line 57, "potential" should be --potential at--.
Column 2,  line 3,  after "the" (second occurrence) insert
                      --above--;
           line 39, "wave form" should be --waveform--.
Column 3,  line 7,  "wave form" should be --waveform--;
           line 12, delete "the" (first occurrence);
           line 13, delete "the" (second occurrence);
           line 47, "state" should be --stage--.
Column 4,  line 22, "necessitate" should be --require--;
           line 33, after "cuit" insert --in--.
```

UNITED STATES PATENT AND TRADEMARK OFFICE
CERTIFICATE OF CORRECTION

PATENT NO. : 4,419,596                     Page 2 of 2

DATED     : December 6, 1983

INVENTOR(S) : Hideo Kikuchi

It is certified that error appears in the above-identified patent and that said Letters Patent is hereby corrected as shown below:

| | | |
|---|---|---|
| Column 5, | line 3, | delete "thus"; |
| | line 13, | after "level" insert --output--; |
| | line 55, | delete "level"; |
| | line 56, | delete "the" (first occurrence); and "level" should be --levels--; |
| | line 60, | "may" should be --may often--; |
| | line 68, | delete "clear,". |
| Column 6, | line 9, | "$Sg_1$" should be --$Sg_n$--; |
| | line 41, | "wave form" should be --waveform--. |
| Column 10, | line 21, | "a" (second occurrence) should be --an--. |

Signed and Sealed this

Twenty-fourth Day of July 1984

[SEAL]

Attest:

GERALD J. MOSSINGHOFF

Attesting Officer     Commissioner of Patents and Trademarks